United States Patent
Willems et al.

(10) Patent No.: US 9,809,039 B2
(45) Date of Patent: Nov. 7, 2017

(54) PLASMA GENERATING DEVICE

(71) Applicant: OCE-TECHNOLOGIES B.V., Venlo (NL)

(72) Inventors: Guido G. Willems, Venlo (NL); Hermanus M. Kuypers, Venlo (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 15/276,165

(22) Filed: Sep. 26, 2016

(65) Prior Publication Data

US 2017/0008308 A1 Jan. 12, 2017

Related U.S. Application Data

(63) Continuation of application No. PCT/EP2015/057809, filed on Apr. 10, 2015.

(30) Foreign Application Priority Data

Apr. 11, 2014 (EP) .................................. 14164447

(51) Int. Cl.
*B41F 23/00* (2006.01)
*B41J 11/00* (2006.01)
*H05H 1/24* (2006.01)
*H01J 37/32* (2006.01)

(52) U.S. Cl.
CPC ............ *B41J 11/002* (2013.01); *B41F 23/00* (2013.01); *B41J 11/0015* (2013.01); *H01J 37/32568* (2013.01); *H01J 37/32761* (2013.01); *H01J 37/32798* (2013.01); *H05H 1/2406* (2013.01);

(Continued)

(58) Field of Classification Search
CPC ............................ B41J 11/002; B41J 11/0015;
H01J 37/32761; H01J 37/32568;
H01J 37/32798; H01J 2237/002;
B41F 23/00; H05H 1/2406;
H05H 2001/2142
See application file for complete search history.

(56) References Cited

U.S. PATENT DOCUMENTS

| 3,796,591 A * | 3/1974 | Schoumaker ............ H05H 1/44 |
| | | 204/164 |
| 2007/0207276 A1 | 9/2007 | Uno et al. |
| 2009/0202734 A1 | 8/2009 | Dhindsa |

FOREIGN PATENT DOCUMENTS

| FR | 2 578 176 A1 | 9/1986 |
| GB | 925354 | 5/1963 |
| JP | 58-113378 A | 7/1983 |

(Continued)

*Primary Examiner* — Sharon A Polk
(74) *Attorney, Agent, or Firm* — Birch, Stewart, Kolasch & Birch, LLP

(57) ABSTRACT

A plasma generating device includes a first plasma electrode and a counter electrode facing each other. The first plasma electrode extends in a lateral direction and includes two projections. Each of the two projections protrudes from the first plasma electrode in the direction of the counter electrode over a predetermined distance. The plasma generating device further includes a preload mechanism adapted for urging each of said two projections of the first plasma electrode against the counter electrode. The two projections cooperatively define a plasma gap between the first plasma electrode and the counter electrode. The counter electrode includes a support surface facing said plasma gap. The support surface is substantially flat along the plasma gap.

14 Claims, 5 Drawing Sheets

(52) U.S. Cl.
    CPC .............................. *H01J 2237/002* (2013.01);
                                    *H05H 2001/2412* (2013.01)

(56) References Cited

FOREIGN PATENT DOCUMENTS

| | | | |
|---|---|---|---|
| JP | 2005-209809 A | | 8/2005 |
| JP | 2011-59639 A | | 3/2011 |
| JP | 2011059639 A | * | 3/2011 |
| WO | WO 2007/032420 A1 | | 3/2007 |
| WO | WO 2013/104753 A2 | | 7/2013 |

* cited by examiner

PLASMA GENERATING DEVICE

CROSS REFERENCE TO RELATED APPLICATIONS

This application is a Continuation of PCT International Application No. PCT/EP2015/057809, filed on Apr. 10, 2015, which claims priority under 35 U.S.C. 119(a) to Patent Application No. 14164447.6, filed in Europe on Apr. 11, 2014, all of which are hereby expressly incorporated by reference into the present application.

FIELD OF THE INVENTION

The present invention relates to a plasma generating device. The present invention further relates to a method of assembling a plasma generating device. The present invention further relates to a method of treating a print substrate. The present invention further relates to an inkjet printer comprising the plasma generating device.

BACKGROUND ART

A known printing system comprises a print station and a plasma generating device. Said plasma generating device is provided for providing plasma to a print substrate. Said print station is provided for applying an image on the print substrate after the plasma generating device has treated the print substrate by the plasma. The plasma generating device comprises a plasma electrode and a counter electrode having a plasma gap arranged in between them. The plasma is generated in operation of the plasma generating device inside the plasma gap between the plasma electrode and the counter electrode. Said plasma is used to chemically modify the surface of the print substrate. For example it is generally known that materials such as plastics, cloth, and paper may be passed through the plasma gap in order to change the surface energy of the material as is known from, for example, FR2578176 and GB925354.

A uniform plasma throughout the plasma gap is demanded to obtain a uniform surface energy of the print substrate. It is known that the distance of the plasma gap between the plasma electrode and the counter electrode is preferably uniform in order to obtain said uniform plasma.

In an example of the application of plasma on a web based print substrate the counter electrode is a cylindrical roller having a peripheral surface. In operation the peripheral surface of the cylindrical roller is rotated along the stationary plasma electrode. The plasma electrode is arranged extending in the axial direction of the cylindrical roller.

In another example of the application of plasma on a cut sheet print substrate the counter electrode comprises a stationary flat surface along the plasma gap. In any of these examples the distance of the plasma gap between the plasma electrode and the counter electrode is adjusted prior to operating the plasma generating device by measuring the distance in the plasma gap and if necessary adjusting the position of one end or both ends of the plasma electrode with respect to the counter electrode. The adjustment of the plasma gap is time consuming and measurements need to be carried out along a lateral direction of the plasma gap.

Even more in case the plasma generating device comprises more than one plasma electrode arranged with respect to the common counter electrode, each of the corresponding plasma gaps with respect to the counter electrode needs to be measured independently and if necessary the position of each of the corresponding plasma electrode needs to be adjusted.

SUMMARY OF THE INVENTION

It is accordingly an object of the present invention to provide a plasma generating device having a simple construction which is suitable for easily obtaining an accurately defined and uniform plasma gap.

This object is attained by a plasma generating device, the plasma generating device comprising a first plasma electrode and a counter electrode facing each other, the first plasma electrode extending in a lateral direction L and comprising two projections, each of the two projections being arranged near an end portion of the first plasma electrode and opposite with respect to each other in the lateral direction L, each of the two projections protruding from the first plasma electrode in the direction of the counter electrode over a predetermined distance P; the plasma generating device further comprising a preload mechanism adapted for urging each of said two projections of the first plasma electrode in a direction U against the counter electrode, wherein the two projections cooperatively define a plasma gap between the first plasma electrode and the counter electrode, wherein the counter electrode comprises a support surface facing said plasma gap, wherein said support surface is substantially flat along the plasma gap.

The two projections protrude from the first plasma electrode in the direction of the counter electrode over a predetermined distance P. An accurately defined plasma gap is obtained as the preload mechanism urges the two projections against the counter electrode. The two projections determine the distance in the plasma gap along the lateral direction L of the plasma gap. The support surface of the counter electrode is substantially flat along the plasma gap, thereby enhancing the uniformity of the plasma in the plasma gap. The advantage is that no measurement of the plasma gap has to be carried out in order to obtain an accurately defined plasma gap. The shape and size of the two projections may be easily selected by a person skilled in the art in order to obtain an uniform plasma gap.

Another advantage of the plasma generating device is that the plasma electrode is not fixed to the counter electrode and that the projections are not connected to the support surface. It is known that in operation of the plasma generating device heat is generated. The generated heat may considerably increase the temperature of the elements of the plasma generating device. Even in case one of the plasma electrode and the support surface expands in the lateral direction L due to increased temperature, such expansion will not lead to bending of any of the plasma electrode and the support surface as the projections may move with respect to the support surface in the lateral direction L (for example by means of a sliding movement). As a result the distance in the plasma gap is kept substantially constant in operation of the plasma generating device over a wide temperature range of the plasma generating device.

The preload mechanism may comprise an urging element, which is arranged in contact with the first plasma electrode for urging both projections of the first plasma electrode in a direction U against the support surface. In an alternative example the preload mechanism may comprise a plurality of preload elements, such as coil springs, wherein each preload element is arranged in contact with a projection for urging said projection of the plasma electrode in the direction U against the support surface.

In an embodiment each projection comprises a contact surface for urging against the counter electrode and wherein the preload mechanism is adapted for urging each of said two projections of the first plasma electrode against the counter electrode at the respective contact surface.

In an embodiment both of the two projections protrude over substantially the same predetermined distance in the direction of the counter electrode. This embodiment enhances an uniform plasma inside the plasma gap. In this embodiment the distance of the plasma gap is held substantially constant along the lateral direction L of the first plasma electrode.

In the present invention, each of the two projections is arranged near an end portion of the first plasma electrode and opposite with respect to each other in the lateral direction L. In this embodiment the distance of the plasma gap is accurately controlled along the lateral direction L of the first plasma electrode between the two end portions.

In an embodiment, the plasma generating device further comprises a print substrate transport mechanism for moving a print substrate in a transport direction T through the plasma gap; wherein the transport direction T is directed substantially perpendicular to the lateral direction L of the first plasma electrode. In this embodiment the print substrate is controllably treated by the plasma inside the plasma gap. The print substrate transport mechanism preferably transports the print substrate in a continuous movement through the plasma gap. The print substrate transport mechanism may comprise a driving roller for driving the print substrate in the transport direction T, may comprise a feed nip, comprising a feed roller and a back roller, and may comprise any other means for transporting the print substrate in the transport direction T through the plasma gap.

In an embodiment, the plasma generating device further comprises a second plasma electrode extending substantially parallel to the first plasma electrode, the second plasma electrode comprising two projections, each of the two projections protruding from the second plasma electrode in the direction of the counter electrode over a second predetermined distance P; and wherein the preload mechanism is further adapted for urging each of said projections of the second plasma generating electrode in the direction U against the counter electrode, wherein the two projections cooperatively define a second plasma gap between the second plasma electrode and the counter electrode. In this embodiment both the first plasma gap and the second plasma gap are accurately defined by the projections of the corresponding plasma electrode. Measurement and adjustment of the plasma gaps is not needed. The two plasma electrodes cooperatively enhance a plasma treatment of the print substrate. Plasma treatments to a higher level while maintaining uniformity over the print substrate are possible.

The preload mechanism may comprise an urging assembly, which is arranged in contact with both the first and second plasma electrode for urging the projections of both the first and second plasma electrode against the support surface. In an alternative example the preload mechanism may comprise a plurality of preload elements, such as coil springs, wherein each preload element is arranged in contact with a projection for urging said projection of one of the plasma electrodes against the counter electrode.

In an embodiment, the plasma generating device further comprises a guiding mechanism, which comprises a guiding element for guiding the print substrate through the plasma gap, which guiding element is arranged adjacent to the first plasma electrode upstream in the transport direction T, wherein the guiding element is adapted to protrude in the direction of the counter electrode with respect to the first plasma electrode over a predetermined distance $D_3$ into the plasma gap. In this embodiment the guiding element guides the print substrate in the transport direction T, while avoiding a blocking of the print substrate by the first plasma electrode. For example, in case a front edge of the print substrate is curved towards the first plasma electrode, said front edge is guided by the guiding element towards the counter electrode and away from the first plasma electrode. Said guiding element may have a guiding surface being shaped in any known way to guide the print substrate. For example said guiding element may have a convex guiding surface or a tapered guiding surface.

In a further embodiment, the preload mechanism is adapted for urging the guiding mechanism against the first plasma electrode in the direction of the counter electrode, thereby defining the predetermined distance $D_3$. In this embodiment the attributes of the shape of the guiding mechanism, including the guiding element, and the first plasma electrode in cooperation define the predetermined distance of the protruding guiding element. The preload mechanism provides that the guiding mechanism and the first plasma electrode contact each other in the direction of the counter electrode at a reference contact surface of the guiding mechanism. In this embodiment the predetermined distance is accurately controlled independently of the distance of the plasma gap.

In an embodiment, the support surface is substantially flat in a direction parallel to the transport direction T. This embodiment enables a substantially linear transport of the print substrate through the plasma gap of the plasma electrode or through the plasma gaps of a plurality of plasma electrodes. Such a linear transport also supports a compact arrangement of the plurality of plasma electrode adjacent to each other in the transport direction T, thereby defining a plurality of plasma gaps adjacent to each other in the transport direction T.

In an embodiment, the counter electrode further comprises a plurality of cooling fins, each cooling fin being connected to the support surface, each cooling fin extending in a first direction substantially parallel to the support surface and protruding in a second direction away from the plasma gap. In this embodiment the cooling fins enhance cooling of the support surface by providing a relative large surface arranged in thermal conduction with the support surface. In a plasma generating device heat may be generated by the plasma inside the plasma gap. As a result of the heat the distance between the plasma electrode and the counter electrode may be disturbed. The cooling fins help to suppress the temperature in the plasma gap and to maintain the support surface in a flat state.

In a particular example the support surface of the counter electrode comprises a ceramic layer. Said ceramic layer is suitable selected for widening the plasma treatment on the print substrate. The use and effect of the ceramic layer on the plasma treatment of a substrate is known to a person skilled in the art. It has been found that a high temperature in the plasma gap may deteriorate the homogeneity of the ceramic layer, For example at high temperature inside the ceramic layer cracks or pin holes may grow due to thermal strain acting on the ceramic layer, which may lead to a break down of the ceramic layer.

In this example the plurality of cooling fins provide the advantage that a durability of the ceramic layer of the support surface is considerably increased by reducing the temperature in the plasma gap.

In a further embodiment, the plasma generating device further comprises a cooling mechanism adapted for providing a flow of a cooling fluid along each of the cooling fins, said cooling fluid being adapted for cooling the counter electrode. In this embodiment the cooling of the counter electrode is further enhanced by cooling the cooling fins using the cooling fluid. As such the cooling fluid conveys heat away from the counter electrode.

In a further embodiment, the first direction of each cooling fin is arranged substantially parallel to the lateral direction L of the first plasma electrode. In this embodiment the cooling fin enhances the stiffness of the support surface in the lateral direction L, which prevents deformation of the support surface. As a result the cooling fin maintains the support surface in a substantially flat state along the plasma gap.

In another aspect of the invention a method is provided of assembling a plasma generating device, the method comprising the steps of: providing a counter electrode; providing a first plasma electrode extending in a lateral direction L and comprising two projections, each of the two projections being arranged near an end portion of the first plasma electrode and opposite with respect to each other in the lateral direction L, thereby arranging each of the two projections protruding from the first plasma electrode in the direction of the counter electrode over a predetermined distance; and urging each of said two projections of the first plasma electrode in a direction U against the counter electrode such that the two projections cooperatively define a plasma gap between the counter electrode and the first plasma electrode.

In the method the plasma generating device is assembled, thereby easily defining the distance in the plasma gap between the first plasma electrode and the counter electrode based on the predetermined distance P of the two projections protruding from the first plasma electrode. In the urging step the two projections are urged against the counter electrode, wherein the two projections cooperatively define a plasma gap between the counter electrode and the first plasma electrode. The method supports a fast assembly of the plasma generating device. The plasma generating device may subsequently be easily disassembled.

In another aspect of the invention a method is provided of treating a print substrate, the method comprising the steps of: providing a counter electrode; providing a first plasma electrode extending in a lateral direction L and comprising two projections, thereby arranging each of the two projections protruding from the first plasma electrode in the direction of the counter electrode over a predetermined distance P; urging each of said two projections of the first plasma electrode in a direction U against the counter electrode such that the two projections cooperatively define a plasma gap between the counter electrode and the first plasma electrode; moving a print substrate through the plasma gap in a transport direction T, wherein the transport direction T is substantially perpendicular to the lateral direction L; and applying a plasma treatment on the print substrate in the plasma gap.

The plasma treatment is applied in operation of the plasma generating device in the plasma gap by the generated plasma onto a first side of the print substrate (the first side of the print substrate is facing the plasma electrode during transport through the plasma gap). A person skilled in the art may suitably select attributes of the plasma (such as electrode voltages, gas composition, etc,) in order to provide the plasma treatment on the print substrate. By the plasma treatment a chemical modification of the outer surface of the print substrate is obtained. The plasma treatment attributes may further be adjusted based on the material type of the (surface of the) print substrate.

In the method of treating a print substrate, the plasma generating device is assembled according to the steps of the method mentioned above. Furthermore the print substrate is moved through the plasma gap and as such a plasma treatment is applied on the print substrate in the plasma gap. The method provides a controlled plasma treatment of the print substrate. For example in case the plasma is uniform in the plasma gap, the surface energy of the print substrate on a first side facing the first plasma electrode is uniformly modified.

Therefore in the present invention a method is provided of using a plasma generating device according to the present invention for treating a print substrate, the method comprising the steps of:

a) moving the print substrate through the plasma gap in a transport direction T, wherein the transport direction T is substantially perpendicular to the lateral direction L; and b) applying a plasma treatment on the print substrate in the plasma gap;

wherein the print substrate moving step is carried out during the plasma treatment step.

As defined herein moving the print substrate through the plasma gap is moving the print substrate from upstream of the plasma gap through the plasma gap to downstream of the plasma gap in the transport direction T. The print substrate is moved through the plasma gap and as such a plasma treatment is applied on the print substrate in the plasma gap. The synchronous action of the print substrate moving step and the plasma treatment step supports controlled plasma treatment of the print substrate. The print substrate may be moved continuously through the plasma gap in the transport direction T during the plasma treatment step. In an alternative embodiment the print substrate may be moved intermittently through the plasma gap in the transport direction T during the plasma treatment step.

In an embodiment, the method comprising the step of applying an inkjet image on the print substrate after the plasma treatment of the print substrate. In this embodiment the inkjet image applied on the first side is influenced by the plasma treatment provided on the first side of the print substrate prior to the inkjet image forming step. For example a surface energy of the print substrate is modified by the plasma treatment. The modified surface energy controls the spreading of inkjet droplets on the first side of the print substrate during application of the inkjet image. As a result attributes of the inkjet image quality, such as image dot size and colour strength of the inkjet image, are accurately controlled.

In another aspect of the invention an inkjet printer is provided comprising an inkjet printing station for providing an inkjet image on a print substrate and a plasma generating device configured for applying a plasma treatment on the print substrate prior to providing the inkjet image on the print substrate, wherein the plasma generating device is according to the present invention.

The inkjet printer according to the invention enhances obtaining a controlled inkjet image quality on various print substrate materials by controllably modifying the surface energy of the print substrate prior to applying the inkjet image on the print substrate.

In the plasma generating device for plasma treating a print substrate according to the present invention, each of the plasma electrodes is an elongated plasma electrode extending in a lateral direction L having two opposing end portions and comprising two projections, each of the two projections being arranged near one of the end portions of the elongated plasma electrode and opposite with respect to each other in the lateral direction L. The end portions substantially extend from the position of the projection at the elongated plasma electrode to the end of the elongated plasma electrode in the lateral direction L. In between the two projections in the lateral direction L the plasma gap is provided for plasma treating the print substrate.

Furthermore in the present invention, the support surface of the counter electrode is arranged for supporting the print substrate. The elongated plasma electrode and the support surface of the counter electrode are arranged facing one another. The preload mechanism is adapted for urging each of said two projections of the plasma electrode in a direction U against the counter electrode, preferably each of said two projections of the plasma electrode is urged against the support surface of the counter electrode. This provides a simple construction suitable for providing an accurate plasma gap between the elongated plasma electrode and the support surface of the counter electrode, which construction can be easily assembled and disassembled when needed.

Thus the present invention pertains to a plasma generating device for plasma treating a substrate, comprising
  a first elongated plasma electrode, a counter electrode and a preload mechanism;
  the counter electrode comprising a support surface for supporting the substrate;
  the first elongated plasma electrode and the support surface of the counter electrode facing one another;
  the first elongated plasma electrode extending in a lateral direction L having two opposing end portions and comprising two projections, each of the two projections being arranged near one of the end portions of the first elongated plasma electrode and opposite with respect to each other in the lateral direction L;
  each of the two projections protruding from the first elongated plasma electrode in the direction of the support surface of the electrode over a predetermined distance P;
  wherein the preload mechanism is adapted for urging each of said two projections of the first plasma electrode in a direction U against the counter electrode, wherein the two projections cooperatively define a plasma gap between the first plasma electrode and the support surface of the counter electrode for plasma treating the substrate;
  said support surface being substantially flat along the plasma gap.

Each of the two projections may comprise a contact surface arranged at an end of the projection for urging against the support surface of the counter electrode. As defined herein each projection protrudes from the plasma electrode over the predetermined distance P between the plasma electrode and the respective contact surface of the projection.

Both of the two projections may protrude over substantially the same predetermined distance P in the direction of the counter electrode such that the predetermined distance is substantially uniform along the plasma gap.

Preferably each of the elongated plasma electrodes has a substantially uniform width facing the plasma gap perpendicular to the lateral direction L. This provides the advantage that, in case a print substrate is moved in a transport direction T substantially perpendicular to the lateral direction L through the plasma gap, each portion of the print substrate receives substantially the same amount of plasma treatment in the plasma gap. For example, the elongated plasma electrode may be a ceramic bar element having an elongated rectangular surface facing the counter electrode.

Further scope of applicability of the present invention will become apparent from the detailed description given hereinafter. However, it should be understood that the detailed description and specific examples, while indicating embodiments of the invention, are given by way of illustration only, since various changes and modifications within the scope of the invention will become apparent to those skilled in the art from this detailed description.

BRIEF DESCRIPTION OF THE DRAWINGS

The present invention will now be described with reference to the accompanying drawings, wherein the same reference numerals have been used to identify the same or similar elements throughout the several views.

DETAILED DESCRIPTION OF EMBODIMENTS

Figure 1A:
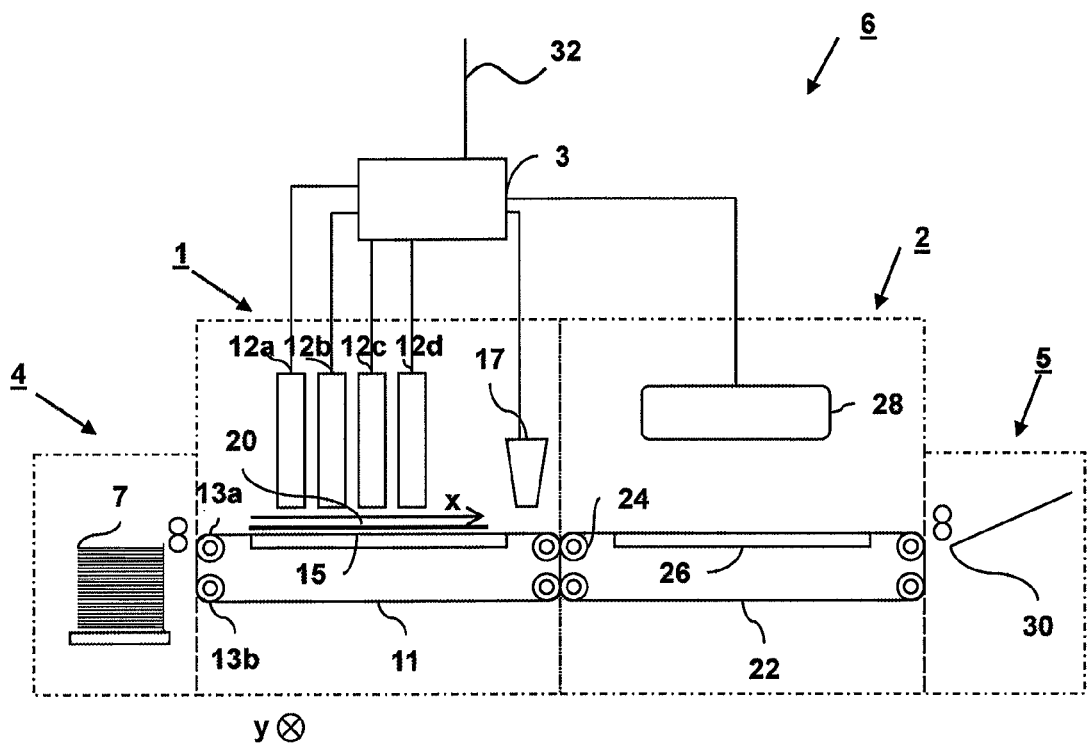
FIG. 1A schematically shows a cut sheet image forming system, wherein printing is achieved using a inkjet printing system.

The present invention will now be described with reference to the accompanying drawings, wherein the same reference numerals have been used to identify the same or similar elements throughout the several views.

In FIG. 1 an inkjet printing system (6) is shown. The inkjet printing system (6) comprises an inkjet marking module (1), an inkjet print drying module (2) and a data controller (3). The controller is connected to a network through a network cable (32). The print data enters the controller through the network and is further processed. The print data can be saved on a non-volatile memory like a hard disk and sent to the inkjet marking module (1) using an interface board.

A cut sheet supply module (4) supplies a receiving medium (20) to the inkjet marking module (1). In the cut sheet supply module (4) the receiving medium is separated from a pile (7) and brought in contact with the belt (11) of the inkjet marking module (1).

The inkjet marking module (1) comprises an assembly of four colour inkjet print heads (12a, 12b, 12c, 12d). The belt (11) transports the receiving medium to the area beneath the four colour inkjet print heads (12a, 12b, 12c, 12d). The colours provided by the inkjet print heads (12a, 12b, 12c, 12d) is black, cyan, magenta and yellow. When receiving the print data, the inkjet print heads (12a, 12b, 12c, 12d) each generate droplets of inkjet marking material and position these droplets on the receiving medium (20).

The belt (11) is transported by an assembly of belt rollers (13a, 13b). The belt (11) is transported by one roller belt roller (13a) in the direction of x, and the position of the belt (11) in the direction y is steered by means of another belt roller (13b). The belt (11) comprises holes and the receiving medium (20) is held in close contact with said belt (11) by means of an air suction device (15).

After the inkjet marking material has been printed on the receiving medium, the receiving medium is moved to an area beneath a scanner module (17). The scanner module (17) determines the position of each of the four colour images on the receiving medium (20) and sends this data to the data controller (3).

The receiving medium is transported to the inkjet print drying module (2). The inkjet print drying module (2) comprises belt (22), which is transported by an assembly of belt rollers (24). The receiving medium (20) is dried on the belt by means of a heating plate (26), thereby evaporating the liquid of the inkjet marking material. The evaporated liquid is condensed in the condenser (28). The dried print product is made available on a tray (30) in the print storage module (5).

The present invention may also be used in alternative printing systems or cut sheet processing systems.

Figure 1B:
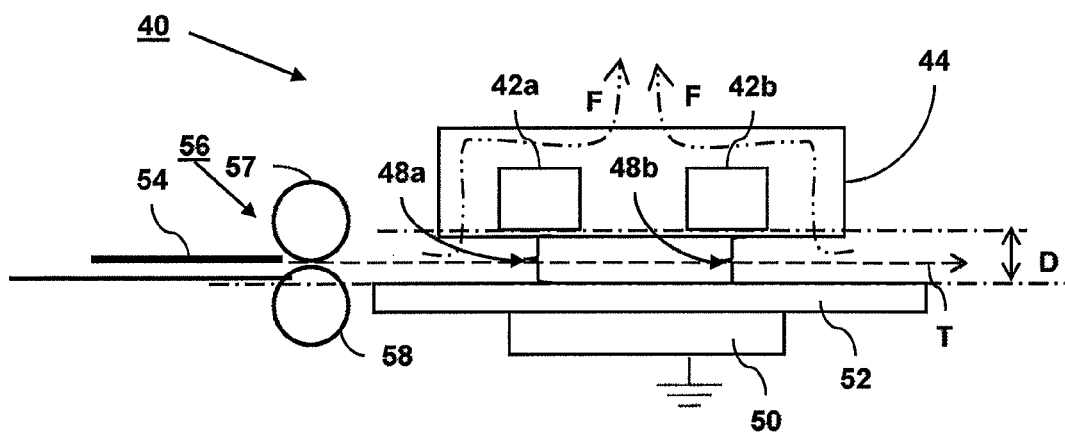
FIG. 1B shows a side view of a plasma treatment device according to the prior art.

FIG. 1B shows the side view of the plasma treatment device according to the prior art. A cut sheet material 54 is transported by a print substrate transporting mechanism 56 through a plasma gap 48a and a plasma gap 48b in the transport direction indicated by arrow T of a plasma generating device 40. The plasma gap 48a, 48b have a distance D, which is sufficient to accommodate the thickness of the transported cut sheet material.

Note that the plasma gap D in FIG. 1B is shown schematically and is typically in the range of 1 to 3 mm. The print substrate transport mechanism 56 comprises a driving roller 58 and a free rotatable roller 57, which together form a transport pinch. The plasma generating device 40 comprises a body 44, two plasma electrodes 42a, 42b, a counter electrode 50 and a support surface 52. The counter electrode 50 is electrically grounded (as indicated by the grounding symbol). The support surface 52 is arranged for supporting the sheet 54 during transport of the sheet 54 in the transport direction T through the plasma gaps 48a, 48b, while the plasma treatment device applies a plasma treatment on the print substrate 54 in the plasma gap 48a, 48b.

An air flow indicated by arrows F is provided inside the plasma generating device 40.

The air flow removes air contaminations, which is generated between the plasma electrode 42 and the counter electrode 50, and directs the contaminations towards an air pump device (not shown). The air pump device further contains a filter in order to remove the air contaminations, such as ozone, from the air flow.

In an example the support surface 52 comprises an electrical insulating layer, for example a ceramic layer, such as a glass layer, or a polymeric layer. The electrical insulating layer arranged in between the counter electrode 50 and the transport path 48 provides that the surface treatment of the cut sheet material 54 during the plasma treatment of the surface of the cut sheet material 54 attains a certain treatment widening. This improves the uniformity and quality of the surface treatment of the cut sheet material 54.

Figure 2A:
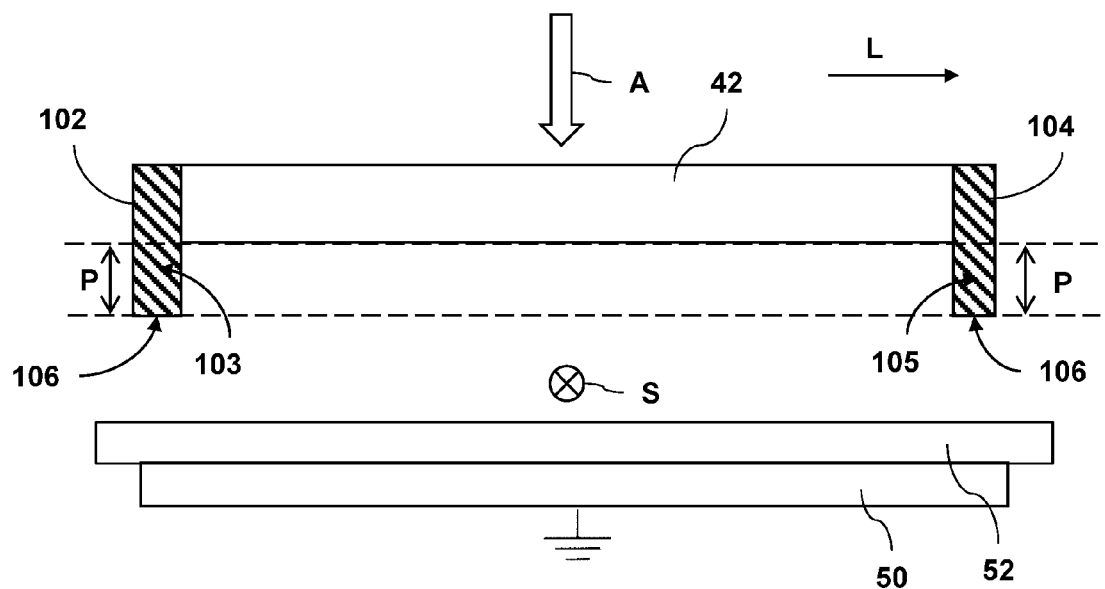
FIG. 2A-FIG. 2B show a method of assembling a plasma treatment device according to the present invention.
Figure 2B:
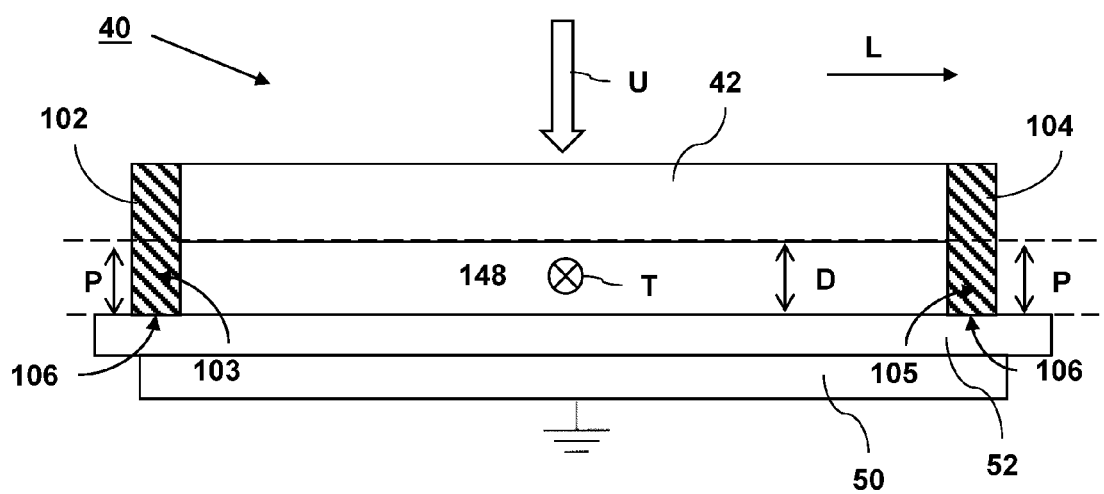

FIGS. 2A and 2B illustrate a method of assembling a plasma generating device. FIG. 2A shows a first stage of the method of assembling the plasma generating device 40. In FIG. 2A a plasma electrode 42 and a counter electrode 50 is shown. The counter electrode comprises a support surface 52. The plasma electrode 42 extends in a lateral direction as indicated by arrow L. At each end of the plasma electrode 42 in the lateral direction L a projection 102, 104 is provided. Each of said two projections 102, 104 is connected to the plasma electrode 42. Each of the two projections 102, 104 comprises a corresponding protruding part 103, 105. Both protruding parts 103, 105 protrude from the plasma electrode 42 over a predetermined distance as indicated by arrows P (i.e. distance between the plasma electrode 42 and a contact surface 106 of the protruding parts 103, 105). The plasma electrode 42 is arranged such that both protruding parts 103, 105 are directed in the direction of the support surface 52 of the counter electrode 50. The support surface 52 extends in a direction perpendicular to the lateral direction L (indicated by arrow S). In the first stage of the method the plasma electrode 42 is moved towards the support surface 52 as indicated by arrow A.

In FIG. 2B a second stage of the method is shown. In the second stage shown in FIG. 2B the two protruding parts 103, 105 of the corresponding projections 102, 104 are urged against the support surface 52 of the counter electrode 50 at a corresponding contact surface 106 of the protruding parts 103, 105 in an urging direction as indicated by arrow U. The two protruding parts 103, 105 of the corresponding projections 102, 104 cooperatively define a plasma gap 148 between the counter electrode 50 and the plasma electrode 42. The plasma gap 148 has a distance between the support surface 52 of the counter electrode 50 and the plasma electrode 42 indicated by arrow D. The distance D is determined by the predetermined distance P defined by the protruding parts 103, 105. The support surface 52 is substantially flat along the plasma gap 148 in the lateral direction L. In the embodiment shown both protruding parts 103, 105 have substantially the same predetermined distance P and the distance D is substantially constant in the plasma gap 148 along the lateral direction L. As a result the plasma generating device 40 is assembled having a plasma gap 148 wherein the distance D is accurately defined. In this embodiment the two protruding parts 103, 105 of the two projections 102, 104 cooperatively enclose the plasma gap 148 in the lateral direction L. A print substrate may be moved through the plasma gap 148 as illustrated by arrow T in between the two protruding parts 103, 105 of the two projections 102, 104, while the plasma generating device 40 applies a plasma treatment on the print substrate in the plasma gap 148.

By performing the method the plasma generating device is easily assembled while obtaining an accurately defined plasma gap. In an example a skilled operator of the plasma generating device may assemble the plasma generating device, e.g. by hand, without using tooling to determine the plasma gap. In another example the skilled operator may disassemble the plasma generating device, e.g. by hand, optionally carry out a service operation of the plasma generating device, for example clean the support surface 52, and subsequently again assemble the plasma generating device according to the method. Even when the plasma generating device has been disassembled and reassembled, the distance of the plasma gap of the plasma generating device is accurately maintained.

Another advantage of the method and of the resulting plasma generating device 40 is that the plasma electrode 42 is not fixed to the counter electrode 50 and that the contact surfaces 106 of the protruding parts 102, 104 are not connected to the support surface 52. It is known that in operation of the plasma generating device 40 heat is generated. The generated heat may considerably increase the temperature of the elements of the plasma generating device. Even in case one of the plasma electrode 42 and the support surface 52 expands in the lateral direction L due to increased temperature, such expansion will not lead to bending of any of the plasma electrode 42 and the support surface 52 as the contact surfaces 106 may move with respect to the support surface 52 in the lateral direction L (for example by means of a sliding movement). As a result the distance D in the plasma gap 148 is kept substantially constant in operation of the plasma generating device 40 over a wide temperature range of the plasma generating device 40.

In an alternative embodiment (not shown), the predetermined distance P of protruding part 103 may be different from the predetermined distance P of protruding part 105. As a result the distance D in the plasma gap 148 along the lateral direction L changes gradually between the protruding part 103 and the protruding part 105.

Figure 3:
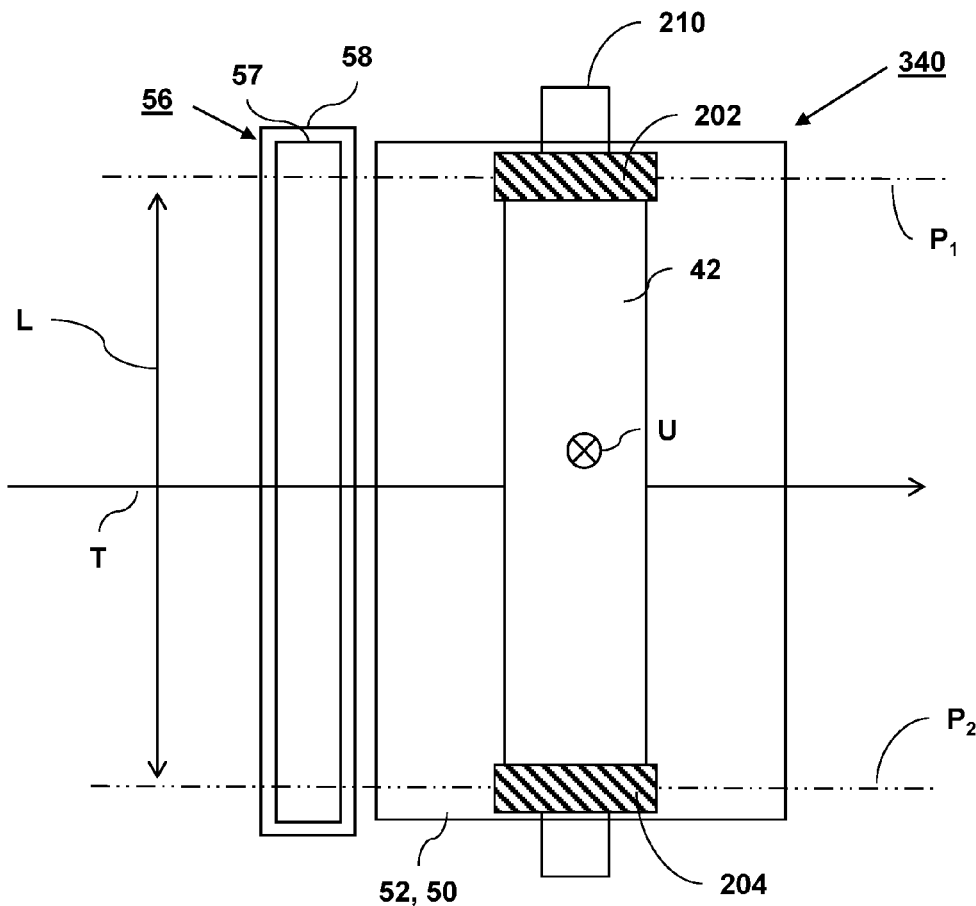
FIG. 3 illustrates an embodiment of the plasma generating device according to the invention.

FIG. 3 illustrates an embodiment of the plasma generating device according to the invention. The plasma generating device 340 comprises a plasma electrode 42, a counter electrode comprising a support surface 52 and a print substrate transport mechanism 56. FIG. 3 shows the plasma generating device 340 when viewed in an urging direction U substantially perpendicular to the support surface 52. The plasma electrode 42 extends in a lateral direction L and is mounted on an axis 210. The plasma electrode 42 comprises two projections 202, 204. Each of said two projections 202, 204 is connected to the plasma electrode 42 and is arranged at an end of the plasma electrode 42 in the lateral direction L. Each of the two projections 202, 204 comprise a protruding part (not shown), which protrude from the plasma electrode 42 in the direction of the support element 52 over a predetermined distance, thereby defining a distance of a plasma gap between the plasma electrode 42 and the support element 52 in a direction parallel to the urging direction U. The projection 202 determines the distance in the plasma gap at the position $P_1$ along the lateral direction L and projection 204 determines the distance in the plasma gap at the position $P_2$ along the lateral direction L.

The print substrate transport mechanism 56 comprises a driving roller 58 and a free rotatable roller 57, which together form a transport pinch. The print substrate transport mechanism 56 transports a print substrate through the transport pinch in a transport direction T along the support surface 52 and through the plasma gap between the plasma electrode 42 and the support surface 52. The transport direction T is substantially perpendicular to the lateral direction L of the plasma electrode. In this embodiment the elongated plasma electrode 42 has a substantially uniform width facing the plasma gap perpendicular to the lateral direction L. This provides the advantage that, in case a print substrate is moved in the transport direction T substantially perpendicular to the lateral direction L through the plasma gap, each portion of the print substrate receives substantially the same amount of plasma treatment in the plasma gap. In this embodiment, the elongated plasma electrode 42 is a ceramic bar element having an elongated rectangular surface facing the counter electrode.

Figure 4:
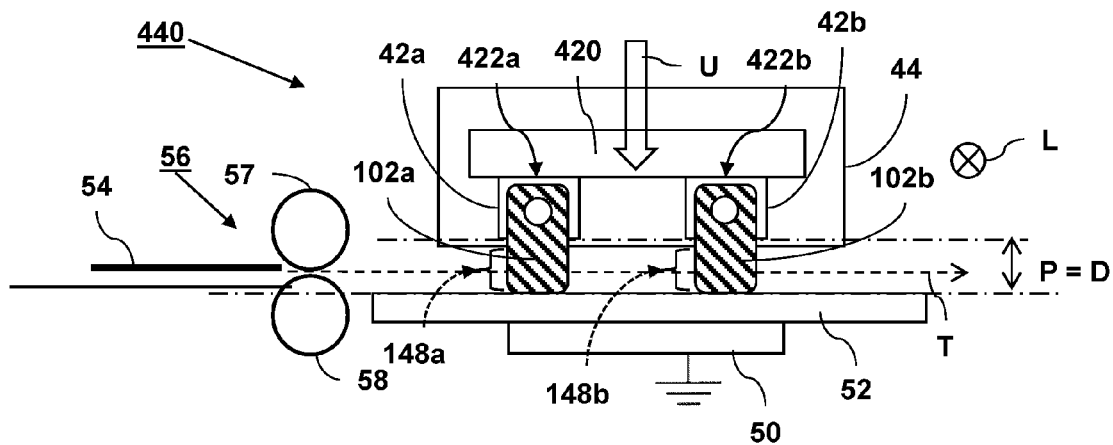
FIG. 4 illustrates in a side view another embodiment of the plasma generating device according to the invention.

FIG. 4 illustrates in a side view another embodiment of the plasma generating device according to the invention. The plasma generating device 440 comprises a first plasma electrode 42a, a second plasma electrode 42b, a counter electrode 50 comprising a support surface 52, a body 44 enclosing both plasma electrodes 42a, 42b and a print substrate transport mechanism 56. The print substrate transport mechanism 56 comprises a driving roller 58 and a free rotatable roller 57, which together form a transport pinch. The print substrate transport mechanism 56 transports a print substrate through the transport pinch in a transport direction T along the support surface 52. The first plasma electrode 42a is arranged adjacent to the second plasma electrode 42b in the transport direction T. Each plasma electrode 42a, 42b extends in a lateral direction L and is arranged facing the support surface 52. Each plasma electrode 42a, 42b comprises a projection 102a, 102b arranged at one end of the corresponding plasma electrode in the lateral direction L and another projection (not shown) arranged at another end of the corresponding plasma electrode in the lateral direction L. The plasma generating device 440 further comprises an urging assembly 420. The urging assembly 420 comprises contact interfaces 422a, 422b. The contact interface 422a contacts the first plasma electrode and the contact interface 422b contacts the second plasma electrodes 42a, 42b in order to urge the corresponding first and second plasma electrodes 42a, 42b towards the support surface 52 in the urging direction as indicated by arrow U. The contact interfaces 422a, 422b in this embodiment is a direct surface contact of the urging assembly 420 to the corresponding first and second plasma electrodes 42a, 42b. In an alternative example (not shown) each of the contact interfaces 422a, 422b comprises a preload element, such as a spring, which provides the urging force in the direction U.

The two projections of each of the corresponding plasma electrodes 42a, 42b are urged against the support surface 52. The projections of the first plasma electrode 42a define a first plasma gap 148a and the projections of the second plasma electrode 42b define a second plasma gap 148b. Each of the projections shown in FIG. 4 extends over a predetermined distance P. As a result each of the plasma gaps 148a, 148b have a distance D between the corresponding plasma electrode 42a, 42b and the support surface 52 (in the urging direction U).

In this embodiment the print substrate transport mechanism 56 transports the print substrate through the plasma gaps 148a, 148b in a transport direction T along the support surface 52, while the plasma generating device 440 applies a plasma treatment on the print substrate 54 in the plasma gap 148a, 148b.

In an alternative embodiment (not shown) the two projections of the first plasma electrode 42 extend over a first predetermined distance and the two projections of the first plasma electrode 42 extend over a second predetermined distance, wherein the first predetermined distance is different from the second predetermined distance. As a result a first plasma gap 148a would have a distance $D_1$ corresponding to the first predetermined distance and a second plasma gap 148b would have a distance $D_2$ corresponding to the second predetermined distance, wherein $D_1$ is different from $D_2$.

Figure 5A:
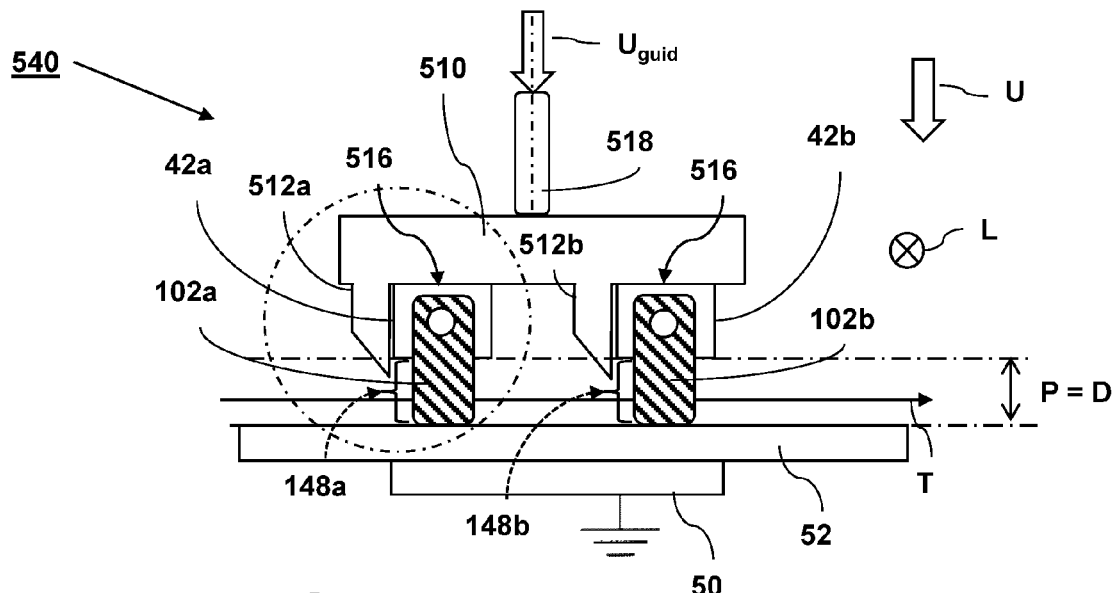
FIGS. 5A and 5B illustrate another embodiment of the plasma generating device according to the invention.
Figure 5B:
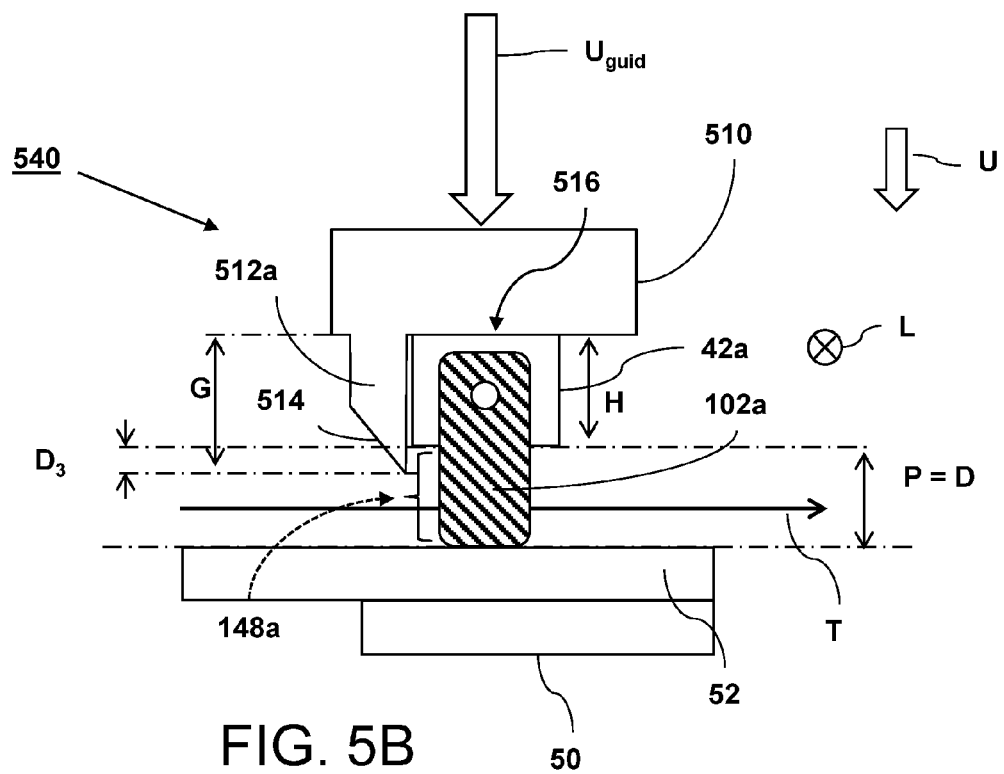

FIGS. 5A and 5B illustrate another embodiment of the plasma generating device according to the invention. FIG. 5A is a side view of the plasma generating device 540. FIG. 5B shows a detail E of the plasma generating device 540 shown in FIG. 5A.

The plasma generating device 540 comprises a first plasma electrode 42a, a second plasma electrode 42b, a counter electrode 50 comprising a support surface 52, and a guiding mechanism 510 comprising two guiding elements 512a, 512b. Each of the plasma electrodes 42a, 42b extends in a lateral direction L. Each of the plasma electrodes 42a, 42b comprises a projection 102a, 102b arranged at one end of the corresponding plasma electrode in the lateral direction L and another projection (not shown) arranged at another end of the corresponding plasma electrode in the lateral direction L (perpendicular to the plane of the view in FIG. 5A).

A preload mechanism (not shown) is provided for urging both first and second plasma electrodes 42a, 42b towards the support surface 52 in the urging direction as indicated by arrow U. The projections of each of the corresponding plasma electrodes 42a, 42b are urged against the support surface 52. The projections of the first plasma electrode 42a define a first plasma gap 148a and the projections of the second plasma electrode 42b define a first plasma gap 148b. Each of the projections shown in FIG. 5A extends over a predetermined distance P. As a result each of the plasma gaps 148a, 148b have a distance D between the corresponding plasma electrode 42a, 42b and the support surface 52 (in the urging direction U).

Each of the guiding elements 512a, 512b of the guiding mechanism 510 is arranged upstream of the corresponding plasma electrodes 42a, 42b with respect to a transport direction T of a print substrate (not shown). Each of the guiding elements 512a, 512b is protruding in the direction of the support surface 52 of the counter electrode 50 with respect to the corresponding plasma electrode 42a, 42b. The guiding mechanism 510 contacts each of the first and second plasma electrodes 42a, 42b at a corresponding reference contact surface 516. The plasma generating device 540 further comprises a second preload element 518, for example a helical spring, which is arranged in contact with the guiding mechanism 510. The helical spring 518 is preloaded for urging the guiding mechanism 510 in a direction as indicated by $U_{guid}$ at the corresponding reference contact surface 516 against the first and second plasma electrodes 42a, 42b.

In FIG. 5B a detail E is shown of the plasma generating device 540 shown in FIG. 5A. In the detail one of the plasma electrodes 42a is shown and one of the one of the guiding elements 512a. The guiding element 512a comprises a guiding surface 514, which guiding surface 514 has tapered shaped. The guiding element 512a protrudes over a predetermined distance $D_3$ into the plasma gap 148a with respect to the first plasma electrode 42a. The predetermined distance $D_3$ is determined by the distance G over which the guiding element 512a extends with respect to the reference contact surface 516 with the plasma electrode 42a and the dimension H of the plasma electrode 42a in the same direction. Even in case the plasma electrode 42a is moved in the urging direction U the third distance $D_3$ is held constant.

The guiding surface 514 guides any print substrate coming from the left in the transport direction T along the plasma electrode 42a and through the plasma gap 148a. In case a leading edge of the print substrate is curled upwards towards the plasma electrode 42a, the guiding surface 514 guides the edge downwards through the plasma gap 148a.

Each of the guiding elements 512a, 512b comprises such a guiding surface 514. A person skilled in the art may easily contemplate alternative suitable shapes of the guiding surface 514, such as a convex shape, a tapered shape, etc for guiding a print substrate along through the plasma gap 148a. Furthermore, in an embodiment several guiding mechanisms 510 including elements 512a, 512b may be distributed along the lateral direction L of the plasma electrodes 42a, 42b.

Alternatively in another embodiment the plasma generating device 340 shown in FIG. 3, which has only one plasma electrode 42, may be modified by including a guiding mechanism 510 having the guiding element 512a shown in FIG. 5B, such that the guiding element 512a is arranged upstream of the plasma electrode 42 in the transport direction T for guiding the print substrate through the plasma gap between the plasma electrode 42 and the support surface 52 of the counter electrode 50, wherein the guiding element 512a protrudes in the direction of the counter electrode 50 with respect to the plasma electrode 42 over a predetermined distance into the plasma gap. A side view of this embodiment of the plasma generating device 340, which has only one plasma electrode 42, and the guiding mechanism 510 looks the same as the one shown in FIG. 5B.

Figure 6A:
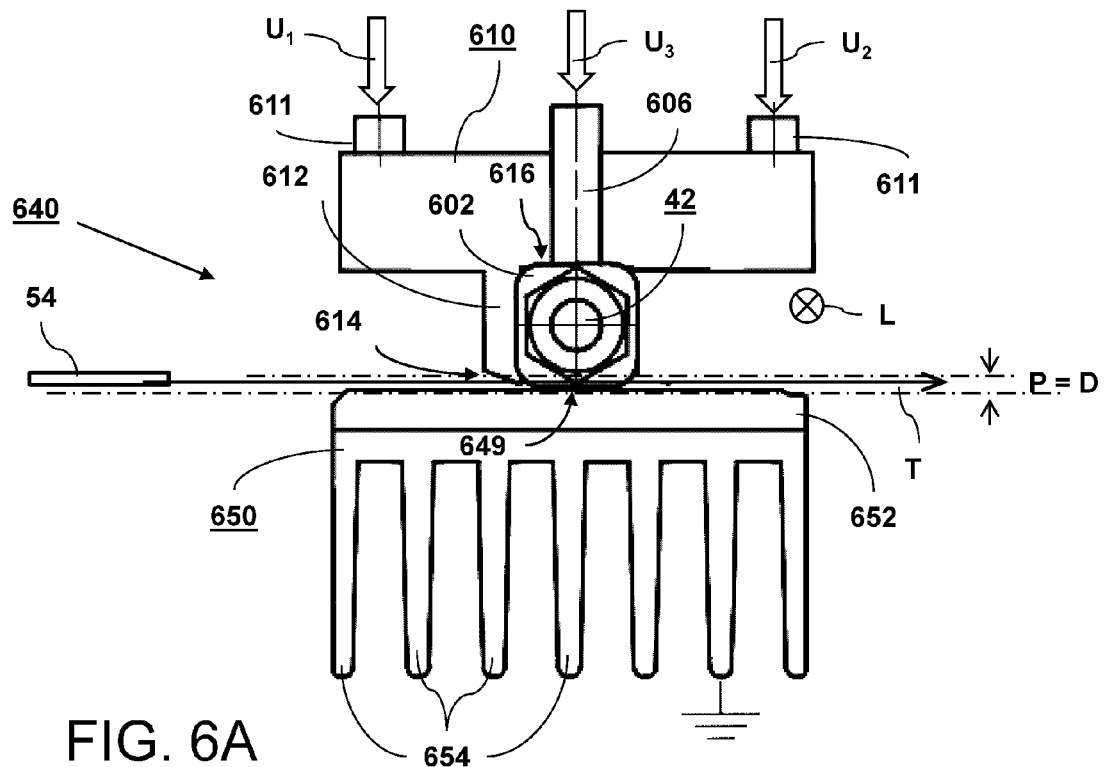
FIGS. 6A and 6B illustrate another embodiment of the plasma generating device according to the invention.
Figure 6B:
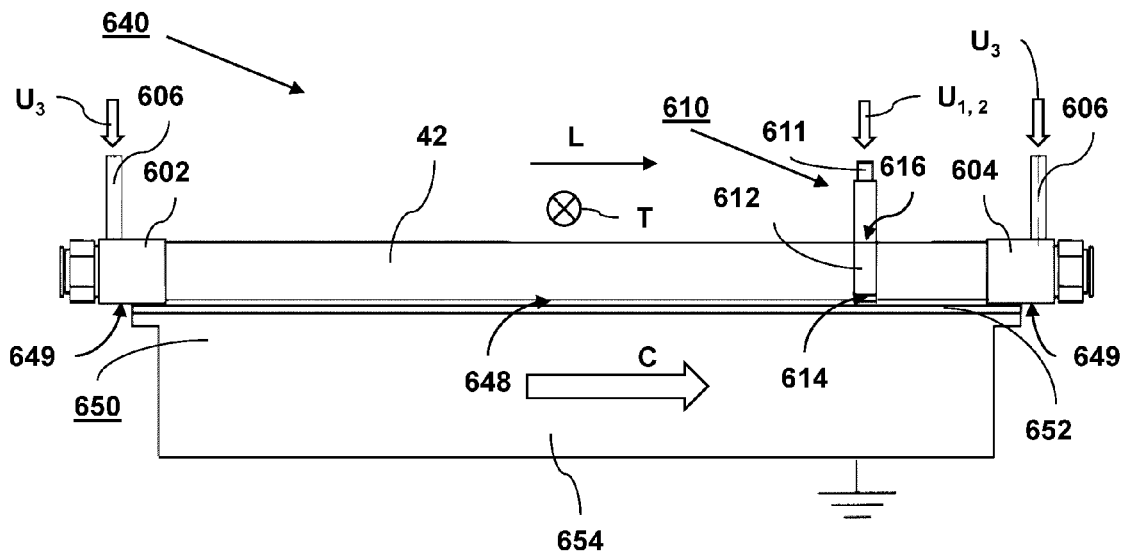

FIGS. 6A and 6B illustrate another embodiment of the plasma generating device according to the invention. FIG. 6A shows a first side view of the plasma generating device 640 along a transport direction T of the print substrate and FIG. 6B shows a second side view of the plasma generating device 640 along a lateral direction L perpendicular to the first side view shown in FIG. 6A.

The plasma generating device 640 comprises a plasma electrode 42, a counter electrode 650 comprising a support surface 652 and a guiding mechanism 610 comprising a guiding element 612. The guiding element 612 comprises a guiding surface 614 for guiding a print substrate through a plasma gap 648 in the transport direction T of the print substrate. The guiding mechanism 610 is urged against the plasma electrode 42 at a contact surface 616 by two urging forces $U_1$, $U_2$ which act on the guiding mechanism 610 in the direction of the support surface 652 as indicated by the arrows $U_1$, $U_2$. The two urging forces $U_1$, $U_2$ are cooperatively arranged to urge the guiding mechanism 610 against the plasma electrode 42 at the reference contact surface 626. Each of the two urging forces $U_1$, $U_2$ is provided by a helical spring 611 having a suitably selected spring force.

The plasma electrode 42 extends in a lateral direction L (as shown in FIG. 6B) and comprises at each end in the lateral direction L a projection element 602, 604. The projection element 602, 604 is a socket which encloses the plasma electrode 42 and is fixed to the plasma electrode 42, for example by gluing. The socket 602, 604 has a peripheral profile which is substantially squarely shaped perpendicular to the lateral direction L (as shown in FIG. 6A) having four surfaces. Each of the four surfaces of the square profile may be used as contact surface against the support surface 652 to define the plasma gap 648 between the plasma electrode 42 and the support surface 652. For each socket 602, 604 one of the four surfaces of the peripheral profile is arranged in parallel to the support surface 652 to serve as the contact surface 649. The contact surfaces 649 of the sockets 602, 604 protrude from the plasma electrode 42 over a predetermined distance P in the direction of the support surface 652, thereby defining a distance D in the plasma gap 648.

Each of the sockets 602, 604 is urged against the support surface 652 of the counter electrode 650 by an urging force indicated by arrow $U_3$. Each of the urging forces $U_3$ is provided by a helical spring 606, which is arranged in contact with the socket 602, 604 and has a suitably selected spring force in the urging direction $U_3$.

The support surface 652 is substantially flat in both the lateral direction L of the plasma electrode 42 and the transport direction T of the print substrate 54. The counter electrode 650 in this embodiment further comprises a plurality of cooling fins 654. Each cooling fin 654 is connected to the support surface and comprises a thermal conductive material, such as steel or aluminum. Each cooling fin 654 extends in a first direction substantially parallel to the lateral direction L of the plasma electrode 42 and protrudes in a second direction away from the plasma gap 648 (substantially parallel to the urging direction $U_1$, $U_2$, $U_3$). Each of the cooling fins 654 enhances cooling of the support surface 652 by providing a large surface. In operation of the plasma generating device 640 heat is produced inside the plasma gap 648. The heat in the plasma gap 648 increases the temperature of the plasma electrode and/or the support surface 652 of the counter electrode 650. As a result of the temperature increase the distance D between the plasma electrode 42 and the support surface 652 may be disturbed. The cooling fins 654 enhance an effective cooling of the support surface 652.

In the embodiment a cooling fluid, such as a cooled air or a cooled liquid, is transported along the cooling fins 654 in a direction indicated by arrow C substantially parallel to the lateral direction L in order to enhance the cooling of the cooling fins 654 and of the support surface 652.

The cooling fins 654 provide stiffness to the support surface, especially in the lateral direction L, and thereby support maintaining the support surface 652 in a flat state along the plasma gap 654, even in case the temperature of the support surface 652 increases.

It has been further found that, in case the support layer 652 comprises a ceramic layer, high temperature in the plasma gap 648 may deteriorate the homogeneity of a ceramic layer of the support surface 652. For example at high temperature inside the ceramic layer cracks or pin holes may grow due to thermal strain acting on the ceramic layer (provided by expansion of the counter electrode structure 650), which may lead to a break down of the ceramic layer.

In this example the plurality of cooling fins 654 provide the advantage that a durability of the ceramic layer of the support surface 652 is considerably increased by reducing the temperature in the plasma gap and by providing stiffness to the counter electrode 650.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims is herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A plasma generating device, comprising:
   a first plasma electrode and a counter electrode facing each other, the first plasma electrode extending in a lateral direction and comprising two projections, each of the two projections being arranged near an end portion of the first plasma electrode and opposite with respect to each other in the lateral direction, each of the two projections protruding from the first plasma electrode in a vertical direction towards the counter electrode over a first predetermined distance;
   a preload mechanism adapted for urging each of said two projections of the first plasma electrode in the vertical direction against the counter electrode, such that the two projections cooperatively space the first plasma electrode at a first distance from the counter electrode to define a plasma gap between the first plasma electrode and the counter electrode; and
   a print substrate transport mechanism for moving a print substrate in a transport direction through the plasma gap,
   wherein the transport direction is directed substantially perpendicular to the lateral direction of the first plasma electrode, and
   wherein the counter electrode comprises a support surface facing said plasma gap, wherein said support surface is substantially flat along the plasma gap.

2. The plasma generating device according to claim 1, wherein each projection comprises a contact surface for urging against the counter electrode, and
   wherein the preload mechanism is adapted for urging each of said two projections of the first plasma electrode against the counter electrode at the respective contact surface.

3. The plasma generating device according to claim 1, further comprising a second plasma electrode extending substantially parallel to the first plasma electrode, the second plasma electrode comprising two projections, each of the two projections protruding of the second plasma electrode in the vertical direction towards the counter electrode over a second predetermined distance, and
   wherein the preload mechanism is further configured to urge each of said projections of the second plasma generating electrode in the vertical direction against the counter electrode, wherein the two projections of the second plasma generating electrode cooperatively define a second plasma gap between the second plasma electrode and the counter electrode.

4. The plasma generating device according to claim 1, further comprising a guiding mechanism comprising a guiding element for guiding the print substrate through the plasma gap, which guiding element is arranged adjacent to the first plasma electrode upstream in the transport direction,
   wherein the guiding element is adapted to protrude in the direction of the counter electrode with respect to the first plasma electrode over a second predetermined distance into the plasma gap.

5. The plasma generating device according to claim 4, wherein the preload mechanism is adapted for urging the guiding mechanism against the first plasma electrode in the vertical direction towards the counter electrode, thereby defining the second predetermined distance.

6. The plasma generating device according to claim 1, wherein the support surface is substantially flat in a direction parallel to the transport direction.

7. The plasma generating device according to claim 6, wherein the counter electrode further comprises a plurality of cooling fins, each cooling fin being connected to the support surface, each cooling fin extending in a first direction substantially parallel to the support surface and protruding in a second direction away from the plasma gap.

8. The plasma generating device according to claim 7, wherein the plasma generating device further comprises a cooling mechanism adapted for providing a flow of a cooling fluid along each of the cooling fins, said cooling fluid being adapted for cooling the counter electrode.

9. The plasma generating device according to claim 7, wherein the first direction of each cooling fin is arranged substantially parallel to the lateral direction of the first plasma electrode.

10. An inkjet printer comprising an inkjet printing station for providing an inkjet image on a print substrate and a plasma generating device configured for applying a plasma treatment on the print substrate prior to providing the inkjet image on the print substrate, wherein the plasma generating device is according to claim 1.

11. The plasma generating device according to claim 1, wherein the preload mechanism is adapted for urging the two projections into positions such that the projections determine a distance between the first plasma electrode and the counter electrode, and wherein the two projections in said positions are not fixed with respect to the counter electrode.

12. A method of assembling a plasma generating device, the method comprising the steps of:
   a) providing a counter electrode;
   b) providing a first plasma electrode extending in a lateral direction and comprising two projections, each of the two projections being arranged near an end portion of the first plasma electrode and opposite with respect to each other in the lateral direction, thereby arranging each of the two projections protruding from the first plasma electrode a vertical direction towards the counter electrode over a first predetermined distance; and
   c) urging each of said two projections of the first plasma electrode in the vertical direction against the counter electrode such that the two projections cooperatively define a plasma gap between the counter electrode and the first plasma electrode.

13. A method of using a plasma generating device according to claim 1 for treating a print substrate, the method comprising the steps of:
   a) moving the print substrate through the plasma gap in a transport direction, wherein the transport direction is substantially perpendicular to the lateral direction; and
   b) applying a plasma treatment on the print substrate in the plasma gap;
   wherein the print substrate moving step is carried out during the plasma treatment step.

14. The method according to claim 13, the method further comprising the step of:
   c) applying an inkjet image on the print substrate after the plasma treatment of the print substrate.

* * * * *